(12) United States Patent
Matsuda et al.

(10) Patent No.: US 7,859,263 B2
(45) Date of Patent: Dec. 28, 2010

(54) MAGNETIC RESONANCE IMAGING APPARATUS AND PROGRAM, AND RF PULSE TRANSMISSION METHOD

(75) Inventors: Tsuyoshi Matsuda, Tokyo (JP); Hidenori Kawai, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 128 days.

(21) Appl. No.: 12/350,069

(22) Filed: Jan. 7, 2009

(65) Prior Publication Data

US 2009/0179641 A1    Jul. 16, 2009

(30) Foreign Application Priority Data

Jan. 10, 2008    (JP) .............................. 2008-003301

(51) Int. Cl.
G01V 3/00    (2006.01)
(52) U.S. Cl. ....................... 324/309; 324/314
(58) Field of Classification Search ................ 324/309, 324/314
See application file for complete search history.

(56) References Cited

U.S. PATENT DOCUMENTS

| | | | |
|---|---|---|---|
| 4,115,730 A | 9/1978 | Mansfield | |
| 4,411,270 A | 10/1983 | Damadian | |
| 4,458,203 A | 7/1984 | Young | |
| 4,509,015 A | 4/1985 | Ordidge et al. | |
| 4,843,322 A * | 6/1989 | Glover ........................ | 324/309 |
| 4,845,430 A | 7/1989 | Nakabayashi | |
| 5,222,500 A | 6/1993 | Sugimoto | |
| 5,298,862 A | 3/1994 | Hennig | |
| 5,378,986 A | 1/1995 | Seo et al. | |
| 5,427,100 A | 6/1995 | Higashi et al. | |
| 5,749,834 A | 5/1998 | Hushek et al. | |
| 5,818,229 A * | 10/1998 | Kanazawa ................... | 324/309 |
| 6,891,372 B2 | 5/2005 | Steinhoff et al. | |
| 7,557,576 B1 * | 7/2009 | Morrone ..................... | 324/314 |
| 7,710,115 B2 * | 5/2010 | Hargreaves ................. | 324/309 |

FOREIGN PATENT DOCUMENTS

JP    63-9432    1/1988

* cited by examiner

*Primary Examiner*—Louis M Arana
(74) *Attorney, Agent, or Firm*—Armstrong Teasdale LLP (57) ABSTRACT

A magnetic resonance imaging apparatus generates slice images by repeating, for a plurality of consecutive repetition times, transmitting an RF pulse to a plurality of slices and scanning the slices to acquire magnetic resonance signals generated therein, in multi-slice acquisition covering the sequential slices, the sequential slices including at least a first slice, a second slice, a third slice, and a fourth slice. In the first, second, third, and fourth slices, phases of the RF pulses are alternately reversed every consecutive repetition time, and the RF pulses are transmitted to the first, second, third, and fourth slices such that the phases of the RF pulses transmitted to the first and third slices are reversed from each other in each consecutive repetition time and such that the phases of the RF pulses transmitted to the second and fourth slices are reversed from each other in each consecutive repetition time.

20 Claims, 6 Drawing Sheets

MAGNETIC RESONANCE IMAGING APPARATUS AND PROGRAM, AND RF PULSE TRANSMISSION METHOD

CROSS REFERENCE TO RELATED APPLICATIONS

This application claims the benefit of Japanese Patent Application No. 2008-003301 filed Jan. 10, 2008, which is hereby incorporated by reference in its entirety.

BACKGROUND OF THE INVENTION

The embodiments described herein relate to a magnetic resonance imaging apparatus and program, and an RF pulse transmission method.

A magnetic resonance imaging apparatus can acquire a tomographic image of a subject by generating magnetic resonance signals using nuclear magnetic resonance phenomena.

An image data acquisition method used in magnetic resonance imaging apparatuses has been known in which the order of slice plane excitation is specified for multi-slice acquisition performed to acquire many sequential slice planes. In the method, to be concrete, the order of slice plane excitation is specified such that, while slice plane excitation is repeated at a constant period, selection is done such that slice planes are not adjacent to each other for consecutive excitation. This is to realize high-speed data acquisition while suppressing interference between nuclear magnetic resonance signals from mutually adjacent slice planes so as to prevent image contrast deterioration. (See Japanese Unexamined Patent Publication No. Sho 63 (1988)-9432, for example.)

However, even in cases where, as in the above known method, selection is done such that two slice planes are not adjacent to each other for consecutive excitation, using non-rectangular RF pulses which allow side lobe generation causes a slice plane being excited to be affected by overlapping side lobe excitation at adjacent slice planes. This results in non-uniform signal intensity between slices.

BRIEF DESCRIPTION OF THE INVENTION

It is desirable that the problem described previously is solved.

In one aspect, a magnetic resonance imaging apparatus generates slice images by repeating, for a plurality of consecutive repetition times, transmitting an RF pulse to each of a plurality of slices and scanning the plurality of slices to acquire magnetic resonance signals generated therein, in multi-slice acquisition covering the plurality of sequential slices in a subject, the plurality of sequential slices including at least a first slice, a second slice, a third slice, and a fourth slice. In the magnetic resonance imaging apparatus, in the first, second, third, and fourth slices, phases of the RF pulses are alternately reversed every consecutive repetition time, and the RF pulses are transmitted to the first, second, third, and fourth slices such that the phases of the RF pulses transmitted to the first and third slices are reversed from each other in each of the plurality of consecutive repetition times and such that the phases of the RF pulses transmitted to the second and fourth slices are reversed from each other in each of the plurality of consecutive repetition times.

In the scanning of the plurality of slices performed in the magnetic resonance imaging apparatus, preferably the first, third, second, and fourth slices are scanned in this order.

In the scanning of the plurality of slices performed in the magnetic resonance imaging apparatus, preferably odd-numbered slices are scanned first, and even-numbered slices are scanned next.

In the magnetic resonance imaging apparatus, preferably the magnetic resonance signals are acquired by a spin echo method.

In the magnetic resonance imaging apparatus, preferably the magnetic resonance signals are acquired by a gradient echo method.

In the magnetic resonance imaging apparatus, preferably the first, second, third, and fourth slices are mutually parallel.

In another aspect, a method is provided for transmitting RF pulses to a plurality of slices, in multi-slice acquisition covering the plurality of sequential slices in a subject, the plurality of sequential slices including at least a first slice, a second slice, a third slice, and a fourth slice. In the method, in the first, second, third, and fourth slices, phases of the RF pulses are alternately reversed every consecutive repetition time. Also in the method, the RF pulses are transmitted to the first, second, third, and fourth slices such that the phases of the RF pulses transmitted to the first and third slices are reversed from each other in each of the plurality of consecutive repetition times and such that the phases of the RF pulses transmitted to the second and fourth slices are reversed from each other in each of the plurality of consecutive repetition times.

In the scanning of the plurality of slices performed by the method, preferably the first, third, second, and fourth slices are scanned in this order.

In the scanning of the plurality of slices performed by the method, preferably odd-numbered slices are scanned first, and even-numbered slices are scanned next.

In the method, preferably a spin echo sequence is used as a pulse sequence for RF pulse transmission.

In the method, preferably a gradient echo sequence is used as a pulse sequence for RF pulse transmission.

In the method, preferably the first, second, third, and fourth slices are mutually parallel.

In another aspect, a program is provided for causing a computer to generate slice images by repeating, for a plurality of consecutive repetition times, transmitting an RF pulse to each of a plurality of slices and scanning the plurality of slices to acquire magnetic resonance signals generated therein, in multi-slice acquisition covering the plurality of sequential slices in a subject, the plurality of sequential slices including at least a first slice, a second slice, a third slice, and a fourth slice. The program further causes the computer to perform a procedure in which, in the first, second, third, and fourth slices, phases of the RF pulses are alternately reversed every consecutive repetition time, and the RF pulses are transmitted to the first, second, third, and fourth slices such that the phases of the RF pulses transmitted to the first and third slices are reversed from each other in each of the plurality of consecutive repetition times and such that the phases of the RF pulses transmitted to the second and fourth slices are reversed from each other in each of the plurality of consecutive repetition times.

The program preferably causes the computer to scan, in the scanning of the plurality of slices, the first, third, second, and fourth slices in this order.

The program preferably causes the computer to scan, in the scanning of the plurality of slices, odd-numbered slices first and even-numbered slices next.

The program preferably causes the computer to perform a procedure in which a spin echo sequence is used as a pulse sequence for RF pulse transmission.

The program preferably causes the computer to perform a procedure in which a gradient echo sequence is used as a pulse sequence for RF pulse transmission.

The present invention provides a magnetic resonance imaging apparatus and program, and an RF pulse transmission method that make it possible to acquire slice images from multiple slices between which the signal intensity is uniform.

Further objects and advantages of the embodiments described herein will be apparent from the following description of embodiments of the invention as illustrated in the accompanying drawings.

DETAILED DESCRIPTION OF THE INVENTION

Figure 1:
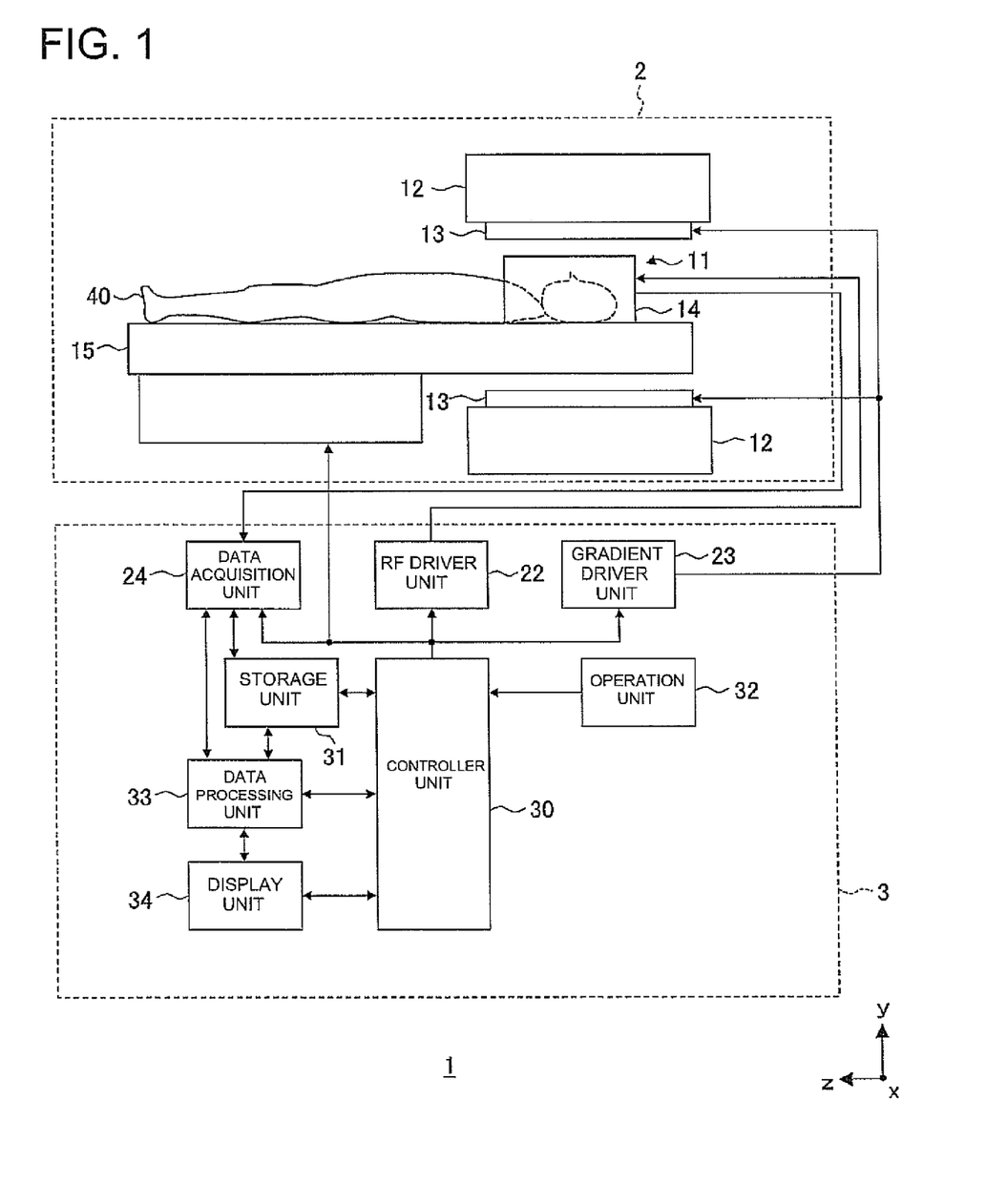
FIG. 1 is a configuration diagram showing the configuration of an exemplary magnetic resonance imaging apparatus.

FIG. 1 is a configuration diagram showing the configuration of an exemplary magnetic resonance imaging apparatus.

As shown in FIG. 1, a magnetic resonance imaging apparatus 1 has a scanning section 2 and an operator console section 3. The scanning section 2 has a static field magnet unit 12, a gradient coil unit 13, an RF coil unit 14, and a cradle 15. The operator console section 3 has an RF driver unit 22, a gradient driver unit 23, a data acquisition unit 24, a controller unit 30, a storage unit 31, an operation unit 32, a data processing unit 33, and a display unit 34.

The scanning section 2 will be described below.

The scanning section 2 includes, as shown in FIG. 1, a static magnetic field space 11 for accommodating a slice region to be imaged of a subject 40. The scanning section 2, responding to control signals received from the operator console section 3, transmits RF pulses to the region to be imaged of the subject 40 placed in the static magnetic field space 11 where a static magnetic field is formed and scans the region to acquire magnetic resonance signals therefrom.

Parts of the scanning section 2 will be individually described in the following.

The static field magnet unit 12 is provided to form a static magnetic field in the static magnetic field space 11 for accommodating the subject 40. The static field magnet unit 12 is of a horizontal magnetic field type. A superconducting magnet (not illustrated) included in the static field magnet unit 12 forms a static magnetic field oriented along the body axis (z-axis direction) of the subject 40 placed in the static magnetic field space 11. The static field magnet unit 12 need not necessarily be of a horizontal magnetic field type. It may be, for example, of a vertical magnetic field type or a permanent magnet type.

The gradient coil unit 13 forms a gradient magnetic field in the static magnetic field space 11 so as to provide the magnetic resonance signals received by the RF coil unit 14 with three-dimensional positional information. The gradient coil unit 13 has three gradient coil systems to be capable of forming three types of gradient magnetic fields, i.e. slice selecting gradient magnetic field, readout gradient magnetic field, and phase encoding gradient magnetic field.

The RF coil unit 14 is disposed, for example, to enclose the region to be imaged of the subject 40. In the static magnetic field space 11 where a static magnetic field is formed by the static field magnet unit 12, the RF coil unit 14 transmits, based on a control signal from the controller unit 30, an RF pulse that is an electromagnetic wave to the subject 40 and thereby generates a high-frequency magnetic field. This excites a spin of protons in the slice to be imaged of the subject 40. The RF coil unit 14 receives, as a magnetic resonance signal, the electromagnetic wave generated when the proton spin thus excited in the slice to be imaged of the subject 40 returns into alignment with the initial magnetization vector. The RF coil unit 14 may transmit and receive an RF pulse using a same RF coil.

The cradle 15 has a table for placing the subject 40 thereon. The cradle 15 moves the subject 40 placed on the table between inside and outside the static magnetic field space 11 based on control signals from the controller unit 30.

The operator console section 3 will be described in the following.

The operator console section 3 performs control to cause the scanning section 2 to scan the subject 40, generates an image of the subject 40 based on the magnetic resonance signals obtained as a result of scanning made by the scanning section 2, and displays the generated image.

Parts of the operator console section 3 will be individually described in the following.

The RF driver unit 22 has a gate modulator (not illustrated), an RF power amplifier (not illustrated), and an RF oscillator (not illustrated) that are used to drive the RF coil unit 14 and form a high-frequency magnetic field in the static magnetic field space 11. The RF driver unit 22 modulates, based on a control signal from the controller unit 30 and using the gate modulator, the RF signal received from the RF oscillator into a signal of predetermined timing having a predetermined envelope. The RF signal modulated by the gate modulator is amplified by the RF power amplifier and then outputted to the RF coil unit 14.

The gradient driver unit 23 drives the gradient coil unit 13 based on a control signal from the controller unit 30 and thereby generates a gradient magnetic field in the static magnetic field space 11. The gradient driver unit 23 has three systems of driver circuits (not illustrated) corresponding to the three gradient coil systems included in the gradient coil unit 13.

The data acquisition unit 24 has a phase detector (not illustrated) and an analog/digital converter (not illustrated) used to acquire the magnetic resonance signals received by the RF coil unit 14. In the data acquisition unit 24, the phase detector phase detects, using the output from the RF oscillator of the RF driver unit 22 as a reference signal, the magnetic resonance signals received from the RF coil unit 14 and outputs the phase-detected analog magnetic resonance signals to the analog/digital converter for conversion into digital signals. The digital signals thus obtained are outputted to the data processing unit 33.

The controller unit 30 has a computer and a recording medium on which a program to be executed by the computer is recorded. The program when executed by the computer causes various parts of the apparatus to carry out operations corresponding to predetermined scanning. The recording medium may be, for example, a ROM, flexible disk, hard disk, optical disk, magneto-optical disk, CD-ROM, or nonvolatile memory card. The controller unit 30 is connected to the operation unit 32 being described later. It processes the operation signals inputted to the operation unit 32 and controls the cradle 15, RF driver unit 22, gradient driver unit 23, and data acquisition unit 24 by outputting control signals to them. The controller unit 30 also controls, to obtain a desired image, the data processing unit 33 and the display unit 34 based on operation signals received from the operation unit 32.

In the present embodiment, the controller unit 30 controls the RF driver unit 22 and the gradient driver unit 23, for example, such that the RF coil unit 14 transmits RF pulses to each of multiple slices with their phases reversed between multiple repetition times, that is, between multiple views.

For a sequence of first through fourth slices, for example, the controller unit 30 controls the RF driver unit 22 and the gradient driver unit 23 such that the pulse phase is reversed between the RF pulses transmitted to the first slice and those transmitted to the third slice and also such that the pulse phase is reversed between the RF pulses transmitted to the second slice and those transmitted to the fourth slice.

The storage unit 31 has a computer and a recording medium on which a program to be executed by the computer to perform predetermined data processing is recorded. The storage unit 31 stores the magnetic resonance signals, not yet processed for spectrum generation, acquired by the data acquisition unit 24 from the subject 40 or a phantom and the spectrum data generated by spectrum generation processing performed by the data processing unit 33 being described later.

The operation unit 32 includes operating devices such as a keyboard and a mouse. The operation unit 32 is used by an operator, for example, to input such data as an imaging protocol and to set a region where an imaging sequence is to be executed. The data about the imaging protocol and the imaging sequence execution region are outputted to the controller unit 30.

The data processing unit 33 has a computer and a recording medium on which a program to be executed by the computer to perform predetermined data processing is recorded. The data processing unit 33 is connected to the controller unit 30 and performs data processing based on control signals received from the controller unit 30. The data processing unit 33 is also connected to the data acquisition unit 24 and generates spectrum data by applying various image processing operations to the magnetic resonance signals outputted from the data acquisition unit 24.

The display unit 34 includes a display device and displays an image on the display screen of the display device based on control signals received from the controller unit 30. The display unit 34 displays, for example, an image regarding an input item about which the operator inputs operation data from the operation unit 32. The display unit 34 also displays a slice image of the subject 40 generated by the data processing unit 33.

The operations performed in imaging the subject 40 using the magnetic resonance imaging apparatus 1 of the present embodiment will be described below.

Figure 2:
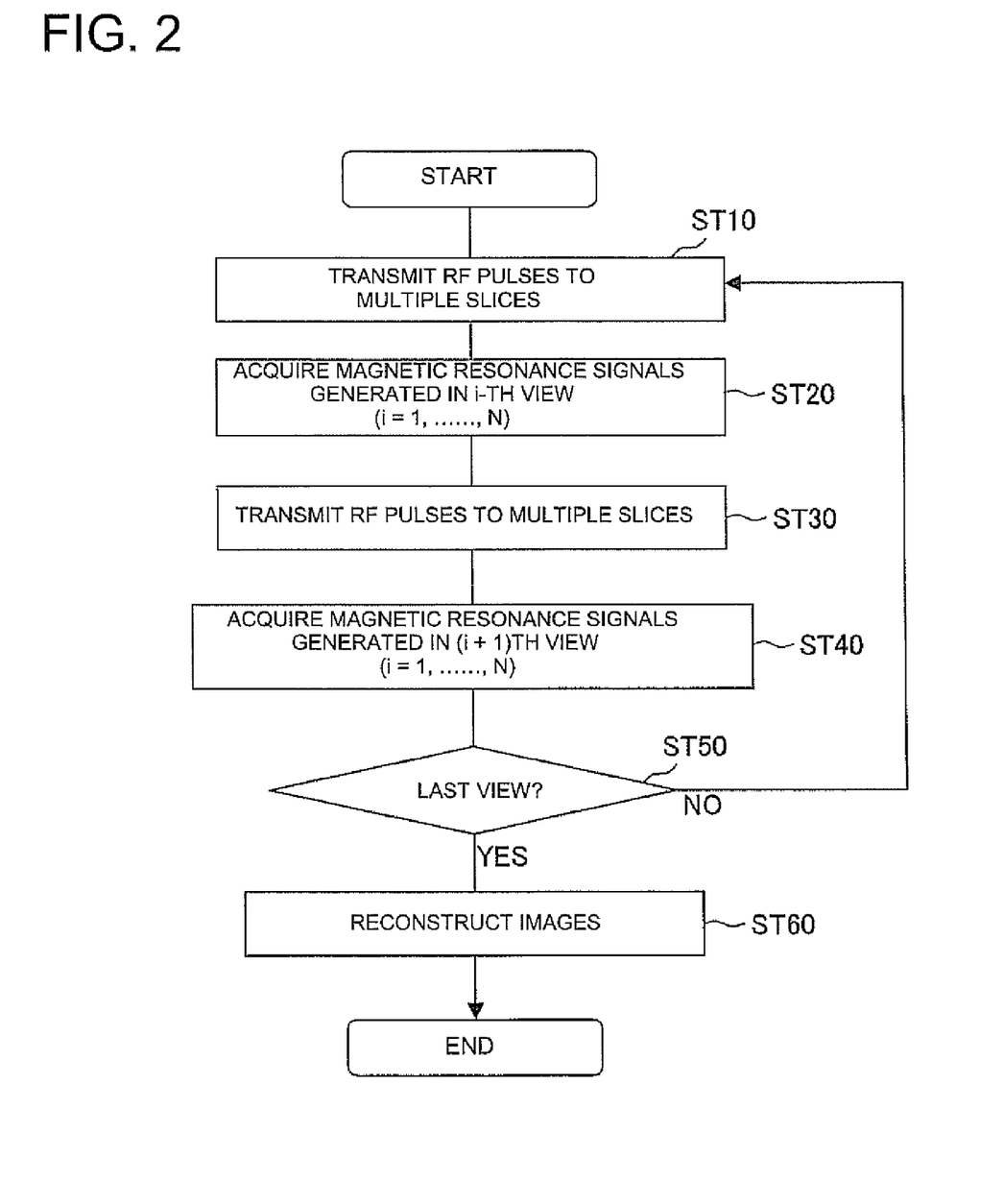
FIG. 2 is a flowchart of operational steps for imaging a subject by multi-slice acquisition using the magnetic resonance imaging apparatus shown in FIG. 1.

FIG. 2 is a flowchart of operational steps for imaging a subject by multi-slice acquisition performed using the magnetic resonance imaging apparatus 1.

Figure 3:
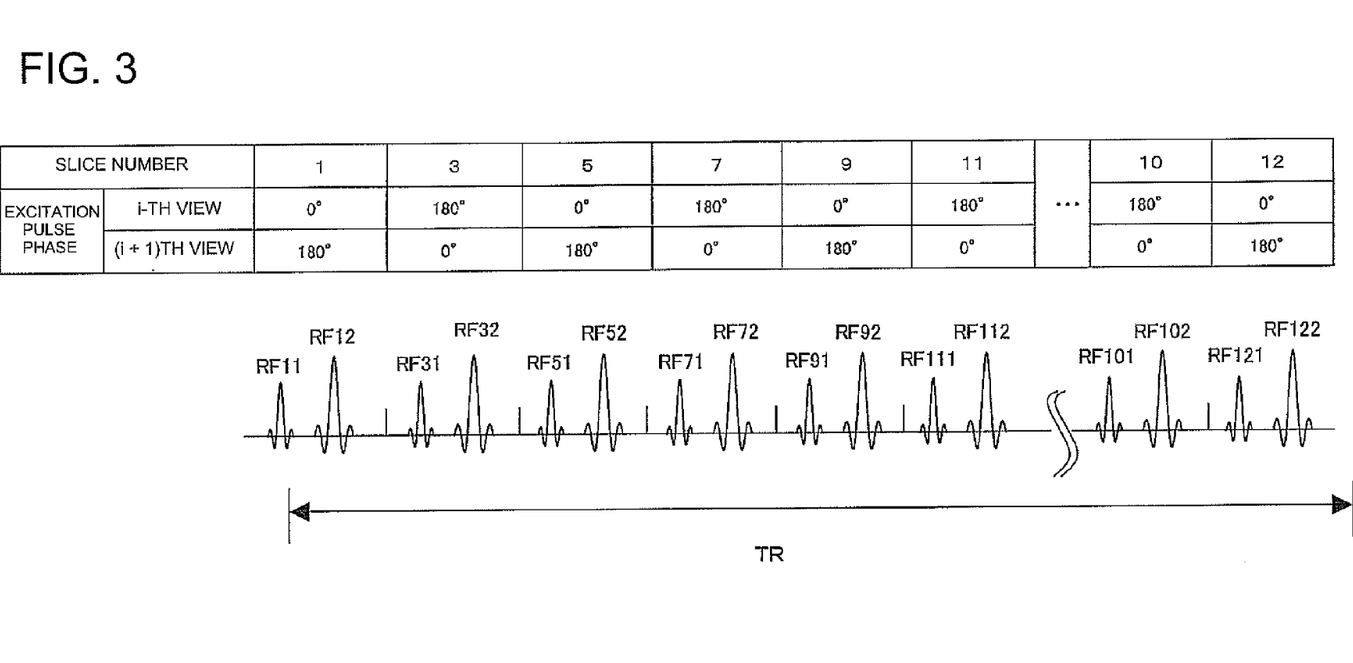
FIG. 3 is a diagram showing a pulse sequence used in multi-slice acquisition using the magnetic resonance imaging apparatus shown in FIG. 1.

FIG. 3 is a diagram showing a pulse sequence used in multi-slice acquisition using the magnetic resonance imaging apparatus 1.

In the present embodiment, RF pulses are transmitted first to odd-numbered slices, for example, the first slice, third slice, . . . , and 13th slice and then to even-numbered slices, for example, the second slice, fourth slice, . . . , and 12th slice. In the pulse sequence diagram of FIG. 3: RF11 represents an excitation pulse transmitted to the first slice; RF12 represents a refocusing pulse transmitted to the first slice; RF121 represents an excitation pulse transmitted to the 12th slice; and RF122 represents a refocusing pulse transmitted to the 12th slice. FIG. 3 also shows the phases of the excitation pulses transmitted to the respective slices in the i-th and (i+1)th views. In multi-slice acquisition, multiple slices are acquired in each repetition time (TR). In the present embodiment, 13 slices are acquired in each repetition time using the pulse sequence shown in FIG. 3 as being described in the following. Images of 13 slices can be obtained by repeating acquisition until the k space for each slice is filled.

First, as shown in FIG. 2, RF pulses are transmitted to multiple slices (ST10).

In this step, to obtain magnetic resonance signals in an i-th view (i=1, . . . , n; where n is an arbitrary integer), the RF coil unit 14 transmits an RF pulse to each of the multiple slices selected in the subject 40, for example, by the spin echo method. In the present embodiment, each RF pulse includes an excitation pulse and a refocusing pulse. The excitation pulses each have a flip angle of, for example, 90 degrees, and the refocusing pulses each have a flip angle of, for example, 180 degrees. In the present embodiment, RF pulses are transmitted to 13 slices in each repetition time (TR) as shown in FIG. 3, and an echo signal is obtained from each of the 13 slices.

It is preferable that the selected multiple slices be mutually parallel. The view performed as described above corresponds to one repetition time (TR) according to the present invention.

For the i-th view, RF pulses are transmitted to the multiple slices in an order in which mutually adjacent slices are not consecutive. For example, RF pulses are transmitted first to the odd-numbered slices and then to the even-numbered slices. At this time, RF pulses are transmitted such that the excitation pulse phase is reversed between the first and third ones of any three adjacent slices.

Table 1 shows the RF pulse transmission order in which RF pulses are transmitted to the slices for the i-th view and the phases of the excitation pulses and refocusing pulses transmitted to the slices (i=1, . . . , n; where n is an arbitrary integer) according to the present embodiment.

TABLE 1

| Slice number | 1 | 2 | 3 | 4 | 5 | 6 | 7 | 8 | 9 | 10 | 11 | 12 | 13 |
|---|---|---|---|---|---|---|---|---|---|---|---|---|---|
| RF pulse transmission order | 1 | 8 | 2 | 9 | 3 | 10 | 4 | 11 | 5 | 12 | 6 | 13 | 7 |
| Excitation pulse phase (deg) | 0 | 180 | 180 | 0 | 0 | 180 | 180 | 0 | 0 | 180 | 180 | 0 | 0 |
| Refocusing pulse phase (deg) | 90 | 90 | 90 | 90 | 90 | 90 | 90 | 90 | 90 | 90 | 90 | 90 | 90 |

For example, when the multiple slices total 13, the RF coil unit 14 transmits an RF pulse including an excitation pulse and a refocusing pulse to each of the multiple slices according to the transmission order shown in Table 1 and the pulse sequence shown in FIG. 3. At this time, the sequentially transmitted RF pulses are arranged such that their excitation pulse phases are sequentially alternated between 0 degree and 180 degrees. The refocusing pulse phases may be arbitrarily set. When, for example, they are set to be 90 degrees apart from the excitation pulse phases, they become 90 degrees for all the multiple slices.

An RF pulse is first transmitted, for example, to the first one of the multiple slices. To the second slice, an RF pulse is eighthly transmitted; to the third slice, the RF pulse is secondly transmitted; . . . , and to the 13th slice, the RF pulse is seventhly transmitted.

The phases of the excitation pulses transmitted to the multiple slices are, for example, as shown in Table 1. The phase of the excitation pulse transmitted to the first slice is 0 degree; the phase of the excitation pulse transmitted to the second slice is 180 degrees; the phase of the excitation pulse transmitted to the third slice is 180 degrees; the phase of the excitation pulse transmitted to the fourth slice is 0 degree; . . . , and the phase of the excitation pulse transmitted to the 13th slice is 0 degree. When listed according to the RF pulse transmission order, the excitation pulse phases are 0 degree, 180 degrees, 0 degree, 180 degrees, . . . , respectively. The repetition time TR in this case is, for example, 2 seconds.

In this case, for example, the first, fifth, ninth, and 13th slices are equivalent to the first slice according to the present invention; the second, sixth, and tenth slices are equivalent to the second slice according to the present invention; the third, seventh, and 11th slices are equivalent to the third slice according to the present invention; and the fourth, eighth, and 12th slices are equivalent to the fourth slice according to the present invention.

In the next step, as shown in FIG. 2, the magnetic resonance signals generated in the i-th view are acquired (ST20).

Namely, the RF coil unit 14 acquires a magnetic resonance signal generated in the i-th view from each of the multiple slices to which RF pulses were transmitted in step ST10.

Next, as shown in FIG. 2, RF pulses are transmitted to the multiple slices (ST30).

In this step, to obtain magnetic resonance signals generated in an (i+1)th view, the RF coil unit 14 transmits RF pulses to the multiple slices selected in the subject 40, for example, by the spin echo method. In the present embodiment, RF pulses are transmitted to 13 slices in each repetition time (TR) as shown in FIG. 3, and an echo signal is obtained from each of the 13 slices.

It is preferable that the selected multiple slices be mutually parallel. The view performed as described above corresponds to one repetition time (TR) according to the present invention.

For the (i+1)th view, RF pulses are transmitted to the multiple slices in an order in which mutually adjacent slices are not consecutive. For example, RF pulses are transmitted first to the odd-numbered slices and then to the even-numbered slices. At this time, RF pulses are transmitted such that the excitation pulse phase is reversed between the first and third ones of any three adjacent slices. It is also arranged such that the phases of the excitation pulses transmitted to the slices for the (i+1)th view are reversed from the phases of the excitation pulses transmitted to the slices for the i-th view.

Table 2 shows the RF pulse transmission order in which RF pulses are transmitted to the slices for the (i+1)th view and the phases of the excitation pulses and refocusing pulses transmitted to the slices according to the present embodiment (i=1, . . . , n; where n is an arbitrary integer).

TABLE 2

| Slice number | 1 | 2 | 3 | 4 | 5 | 6 | 7 | 8 | 9 | 10 | 11 | 12 | 13 |
|---|---|---|---|---|---|---|---|---|---|---|---|---|---|
| RF pulse transmission order | 1 | 8 | 2 | 9 | 3 | 10 | 4 | 11 | 5 | 12 | 6 | 13 | 7 |
| Excitation pulse phase (deg) | 180 | 0 | 0 | 180 | 180 | 0 | 0 | 180 | 180 | 0 | 0 | 180 | 180 |
| Refocusing pulse phase (deg) | 90 | 90 | 90 | 90 | 90 | 90 | 90 | 90 | 90 | 90 | 90 | 90 | 90 |

For example, the RF coil unit 14 transmits an RF pulse including an excitation pulse and a refocusing pulse to each of the multiple slices according to the transmission order shown in Table 2 and the pulse sequence shown in FIG. 3. At this time, the sequentially transmitted RF pulses are arranged such that their excitation pulse phases are sequentially alternated between 180 degrees and 0 degree. The refocusing pulse phases may be arbitrarily set. When, for example, they are set to be 90 degrees apart from the excitation pulse phases, they become 90 degrees for all the multiple slices.

An RF pulse is first transmitted, for example, to the first one of the multiple slices. To the second slice, an RF pulse is eighthly transmitted; to the third slice, the RF pulse is secondly transmitted; . . . , and to the 13th slice, the RF pulse is seventhly transmitted.

The phases of the excitation pulses transmitted to the multiple slices are, for example, as shown in Table 2. The phase of the excitation pulse transmitted to the first slice is 180 degrees; the phase of the excitation pulse transmitted to the second slice is 0 degree; the phase of the excitation pulse transmitted to the third slice is 0 degree; the phase of the excitation pulse transmitted to the fourth slice is 180 degrees; . . . , and the phase of the excitation pulse transmitted to the 13th slice is 180 degrees. When listed according to the RF pulse transmission order, the excitation pulse phases are 0 degree, 180 degrees, 0 degree, 180 degrees, . . . , respectively. The repetition time TR in this case is, for example, 2 seconds.

In the next step, as shown in FIG. 2, the magnetic resonance signals generated in the (i+1)th view are acquired (ST40).

Namely, the RF coil unit 14 acquires a magnetic resonance signal generated in the (i+1)th view from each of the multiple slices to which RF pulses were transmitted in step ST30.

Next, as shown in FIG. 2, whether the magnetic resonance signals acquired in step ST40 are of the last view is determined (ST50).

Namely, the controller unit 30 determines whether the magnetic resonance signals acquired in step ST40 are of the last view. When the magnetic resonance signals acquired in step ST40 are not of the last view (No), the controller unit 30 controls the relevant units to make them continue acquiring magnetic resonance signals.

Next, as show in FIG. 2, when the magnetic resonance signals acquired in step ST40 are of the last view (Yes), image reconstruction is performed (ST60).

Namely, the data processing unit 33 processes the magnetic resonance signals acquired in steps ST20 and ST40 for image reconstruction and outputs the reconstructed images to the display unit 34.

As described above, in an embodiment of the present invention, RF pulses are transmitted to the slices for the i-th view in an order in which no mutually adjacent slices are consecutive. For example, RF pulses are transmitted first to the odd-numbered slices and then to the even-numbered slices. At this time, RF pulses are transmitted such that the excitation pulse phase is reversed between the first and third ones of any three adjacent slices. Next, a magnetic resonance signal generated in the i-th view is acquired from each of the slices. Subsequently, RF pulses are transmitted to the slices for the (i+1)th view in an order in which no mutually adjacent slices are consecutive. At this time, RF pulses are transmitted such that the excitation pulse phase is reversed between the first and third ones of any three adjacent slices. It is also arranged such that the phases of the excitation pulses transmitted to the slices for the (i+1)th view are reversed from the phases of the excitation pulses transmitted to the slices for the i-th view. Next, a magnetic resonance signal generated in the (i+1)th view is acquired from each of the slices. The magnetic resonance signals thus obtained are processed for image reconstruction.

As described above, during a repetition time, i.e. for a view, RF pulses are transmitted to plural slices in an order in which no mutually adjacent slices are consecutive. For example, RF pulses are transmitted first to the odd-numbered slices and then to the even-numbered slices. In this way, interference between adjacent slices can be reduced. Furthermore, RF pulses are transmitted such that the excitation pulse phase is reversed between the first and third ones of any three adjacent slices. When RF pulses are subsequently transmitted to the slices for the succeeding view, the excitation pulse phases are reversed from the phases of the excitation pulses transmitted to the slices for the preceding view. In this way, the signal intensity is uniformized between the magnetic resonance signals acquired from different slices, so that smooth slice images with little signal intensity variations can be reconstructed.

Why, in the above embodiment, the signal intensity is uniformized between the magnetic resonance signals acquired from multiple slices will be explained below.

FIGS. 4(a) and 4(b) are schematic diagrams showing RF pulse profiles. FIG. 4(a) shows an ideal RF pulse profile, and FIG. 4(b) shows the profile of RF pulses used in the present embodiment. In FIG. 4(a), L represents the distance between slices, and t represents the thickness of each slice.

As shown in FIG. 4(a), RF pulses transmitted to slices are each ideally desired to have a rectangular profile so that the RF pulses transmitted to mutually adjacent slices do not mutually overlap. In reality, however, partly because the RF pulse transmission time is limited, spin excitation outside a desired region occurs, and RF pulses transmitted to slices are caused to have a profile including side lobes 50 as shown in FIG. 4(b). In the present embodiment, the thickness t of each slice is 5 mm, and the distance L between slices is 7 mm. The distance L between slices and the repetition time TR affect the degree of interference between the RF pulses transmitted to mutually adjacent slices. The degree of interference between the RF pulses is reduced when the distance L between slices is larger and the repetition time TR is longer.

Take the second slice, for example. It is affected, because the RF pulse profile includes side lobes 50, not only by the RF pulses transmitted to itself but also by the RF pulses transmitted to the first and third slices.

In the following, the results of signal intensity simulation made on 13 slices will be studied.

Table 3 shows the order of RF pulse transmission to the slices and the phases of excitation pulses transmitted to the slices in a prior art case.

TABLE 3

| Slice number | 1 | 2 | 3 | 4 | 5 | 6 | 7 | 8 | 9 | 10 | 11 | 12 | 13 |
|---|---|---|---|---|---|---|---|---|---|---|---|---|---|
| RF pulse transmission order | 1 | 8 | 2 | 9 | 3 | 10 | 4 | 11 | 5 | 12 | 6 | 13 | 7 |
| Excitation pulse phase (view 1) | 0 | 180 | 0 | 180 | 0 | 180 | 0 | 180 | 0 | 180 | 0 | 180 | 0 |
| Excitation pulse phase (view 2) | 180 | 0 | 180 | 0 | 180 | 0 | 180 | 0 | 180 | 0 | 180 | 0 | 180 |

As shown in Table 3, for view 1, an RF pulse is first transmitted, for example, to the first slice. To the second slice, an RF pulse is eighthly transmitted; to the third slice, the RF pulse is secondly transmitted; . . . , and to the 13th slice, the RF pulse is seventhly transmitted.

The phases of the excitation pulses transmitted to the first, second, third, fourth, . . . , and 13th slices are 0 degree, 180 degrees, 0 degree, 180 degrees, . . . , and 0 degree, respectively.

The excitation pulse phases are reversed between consecutive views, so that the phases of excitation pulses transmitted to the slices for view 2 are reversed from the phases of excitation pulses transmitted to the slices for view 1. Hence, the phase of the excitation pulse transmitted to the first slice for view 2 is 180 degrees, and the phase of the excitation pulse transmitted to the second slice for view 2 is 0 degree. The reversal of the excitation pulse phases between consecutive views is repeated for view 1 through view n.

The intensities of the magnetic resonance signals which can be acquired from slices to which RF pulses are transmitted, for views 1 and 2, in the above described manner will be studied based on an example case of the second, third, and fourth slices shown in FIG. 4(b).

The study of the second slice follows.

The side lobe in the second-slice region A is affected by the RF pulse (excitation pulse phase: 0 degree) transmitted to the first slice for view 1, the RF pulse (excitation pulse phase: 180 degrees) transmitted to the second slice for view 1, the RF pulse (excitation pulse phase: 180 degrees) transmitted to the first slice for view 2, and the RF pulse (excitation pulse phase: 0 degree) transmitted to the second slice for view 2.

The side lobe in the second-slice region B is affected by the RF pulse (excitation pulse phase: 0 degree) transmitted to the third slice for view 1, the RF pulse (excitation pulse phase: 180 degrees) transmitted to the second slice for view 1, the RF pulse (excitation pulse phase: 180 degrees) transmitted to the third slice for view 2, and the RF pulse (excitation pulse phase: 0 degree) transmitted to the second slice for view 2.

The study of the third slice follows.

The side lobe in the third-slice region B is affected by the RF pulse (excitation pulse phase: 0 degree) transmitted to the third slice for view 1, the RF pulse (excitation pulse phase: 180 degrees) transmitted to the second slice for view 1, and the RF pulse (excitation pulse phase: 180 degrees) transmitted to the third slice for view 2. In this case, the third slice is not affected by the RF pulse transmitted to the second slice for view 2. It is because the RF pulse transmission to the second slice takes place after the RF pulse transmission to the third slice. Namely, before an RF pulse is transmitted to the second slice for view 2, an RF pulse is transmitted to the third slice for view 2, and when the RF pulse is transmitted to the third slice, a magnetic resonance signal is acquired.

The side lobe in the third-slice region C is affected by the RF pulse (excitation pulse phase: 0 degree) transmitted to the third slice for view 1, the RF pulse (excitation pulse phase: 180 degrees) transmitted to the fourth slice for view 1, and the RF pulse (excitation pulse phase: 180 degrees) transmitted to the third slice for view 2.

The study of the fourth slice follows.

The side lobe in the fourth-slice region C is affected by the RF pulse (excitation pulse phase: 0 degree) transmitted to the third slice for view 1, the RF pulse (excitation pulse phase: 180 degrees) transmitted to the fourth slice for view 1, the RF pulse (excitation pulse phase: 180 degrees) transmitted to the third slice for view 2, and the RF pulse (excitation pulse phase: 0 degree) transmitted to the second slice for view 2.

The side lobe in the fourth-slice region D is affected by the RF pulse (excitation pulse phase: 0 degree) transmitted to the fifth slice for view 1, the RF pulse (excitation pulse phase: 180 degrees) transmitted to the fourth slice for view 1, the RF pulse (excitation pulse phase: 180 degrees) transmitted to the fifth slice for view 2, and the RF pulse (excitation pulse phase: 0 degree) transmitted to the fourth slice for view 2.

The above study results are shown in Tables 4(a) to 4(c). Table 4(a) shows the results of study of the second slice; Table 4(b) shows the results of study of the third slice; and Table 4(c) shows the results of study of the fourth slice. With the excitation pulse phases alternating between 0 degree and 180 degrees, symbols + and − in these tables represent an RF pulse transmission with an excitation pulse phase of 0 degree and an RF pulse transmission with an excitation pulse phase of 180 degrees, respectively.

Tables 4(a) to 4(c)

(a)

| Slice number | 2 | | | | | | | |
|---|---|---|---|---|---|---|---|---|
| Side lobe (Overlap region) | A | | | B | | | | |
| Excitation pulse phase | 0 | 180 | 180 | 0 | 0 | 180 | 180 | 0 |
| Symbol | + | − | − | + | + | − | − | + |
| Sum of symbols | | | | 0 | | | | |

(b)

| Slice number | 3 | | | | | |
|---|---|---|---|---|---|---|
| Side lobe (Overlap region) | | B | | | C | |
| Excitation pulse phase | 0 | 180 | 180 | 0 | 180 | 180 |
| Symbol | + | − | − | + | − | − |
| Sum of symbols | | | −2 | | | |

(c)

| Slice number | 4 | | | | | | | |
|---|---|---|---|---|---|---|---|---|
| Side lobe (Overlap region) | | C | | | | D | | |
| Excitation pulse phase | 0 | 180 | 180 | 0 | 0 | 180 | 180 | 0 |
| Symbol | + | − | − | + | + | − | − | + |
| Sum of symbols | | | | 0 | | | | |

As shown in Tables 4(a) to 4(c), the sum of symbols for the side lobes in regions A and B of the RF pulses transmitted to the second slice is 0. This indicates that, for the side lobes of the RF pulses transmitted to the second slice, the effects of excitation pulses at a phase of 0 degree and the effects of the excitation pulses at a phase of 180 degrees are mutually canceled. The sum of symbols for the side lobes in regions B and C of the RF pulses transmitted to the third slice is −2. This indicates that the side lobes of the RF pulses transmitted to the third slice are affected by excitation pulses at a phase of 180 degrees. The sum of symbols for the side lobes in regions C and D of the RF pulses transmitted to the fourth slice is 0. This indicates that, for the side lobes of the RF pulses transmitted to the fourth slice, the effects of excitation pulses at a phase of 0 degree and the effects of the excitation pulses at a phase of 180 degrees are mutually canceled. The sum of symbols for the side lobes of the RF pulses transmitted to each slice is related with the signal intensity at the slice.

As explained above, when the prior art RF pulse transmission method is used, the sums of symbols for the side lobes of the RF pulses transmitted to the second, third, and fourth slices are 0, −2, and 0, respectively, indicating that the signal intensity is not uniform between the adjacent slices.

Table 5 shows the order of RF pulse transmission to slices and the phases of excitation pulses transmitted to the slices according to the present invention.

TABLE 5

| Slice number | 1 | 2 | 3 | 4 | 5 | 6 | 7 | 8 | 9 | 10 | 11 | 12 | 13 |
|---|---|---|---|---|---|---|---|---|---|---|---|---|---|
| RF pulse transmission order | 1 | 8 | 2 | 9 | 3 | 10 | 4 | 11 | 5 | 12 | 6 | 13 | 7 |
| Excitation pulse phase (view 1) | 0 | 180 | 180 | 0 | 0 | 180 | 180 | 0 | 0 | 180 | 180 | 0 | 0 |
| Excitation pulse phase (view 2) | 180 | 0 | 0 | 180 | 180 | 0 | 0 | 180 | 180 | 0 | 0 | 180 | 180 |

As shown in Table 5, for view 1, an RF pulse is first transmitted, for example, to the first slice. To the second slice, an RF pulse is eighthly transmitted; to the third slice, the RF pulse is secondly transmitted; . . . , and to the 13th slice, the RF pulse is seventhly transmitted.

The phases of the excitation pulses transmitted to the first, second, third, fourth, . . . , and 13th slices are 0 degree, 180 degrees, 180 degrees, 0 degree, . . . , and 0 degree, respectively.

The excitation pulse phases are reversed between consecutive views, so that the phases of excitation pulses transmitted to the slices for view 2 are reversed from the phases of excitation pulses transmitted to the slices for view 1. Hence the phase of the excitation pulse transmitted to the first slice for view 2 is 180 degrees, and the phase of the excitation pulse transmitted to the second slice for view 2 is 0 degree.

Figure 4:
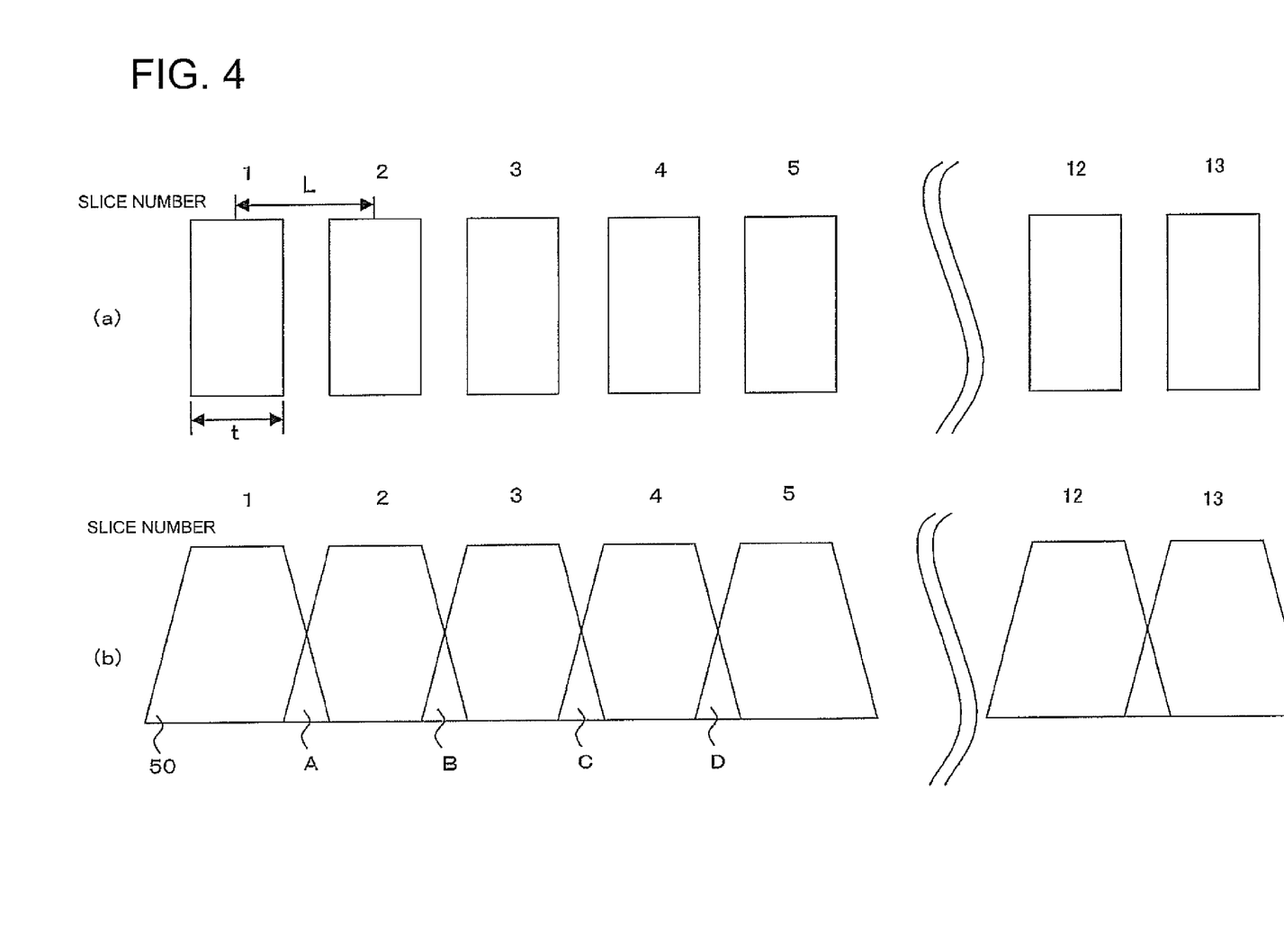
FIGS. 4(a) and 4(b) are schematic diagrams showing RF pulse profiles.

The intensities of the magnetic resonance signals acquired from the slices to which RF pulses are transmitted, for view 2, in the above described manner will be studied based on an example case of the second, third, and fourth slices shown in FIG. 4(*b*).

The study of the second slice follows.

The side lobe in the second-slice region A is affected by the RF pulse (excitation pulse phase: 0 degree) transmitted to the first slice for view 1, the RF pulse (excitation pulse phase: 180 degrees) transmitted to the second slice for view 1, the RF pulse (excitation pulse phase: 180 degrees) transmitted to the first slice for view 2, and the RF pulse (excitation pulse phase: 0 degree) transmitted to the second slice for view 2.

The side lobe in the second-slice region B is affected by the RF pulse (excitation pulse phase: 180 degrees) transmitted to the third slice for view 1, the RF pulse (excitation pulse phase: 180 degrees) transmitted to the second slice for view 1, the RF pulse (excitation pulse phase: 0 degree) transmitted to the third slice for view 2, and the RF pulse (excitation pulse phase: 0 degree) transmitted to the second slice for view 2.

The study of the third slice follows.

The side lobe in the third-slice region B is affected by the RF pulse (excitation pulse phase: 180 degrees) transmitted to the third slice for view 1, the RF pulse (excitation pulse phase: 180 degrees) transmitted to the second slice for view 1, and the RF pulse (excitation pulse phase: 0 degree) transmitted to the third slice for view 2.

The side lobe in the third-slice region C is affected by the RF pulse (excitation pulse phase: 180 degrees) transmitted to the third slice for view 1, the RF pulse (excitation pulse phase: 0 degree) transmitted to the fourth slice for view 1, and the RF pulse (excitation pulse phase: 0 degree) transmitted to the third slice for view 2.

The study of the fourth slice follows.

The side lobe in the fourth-slice region C is affected by the RF pulse (excitation pulse phase: 180 degrees) transmitted to the third slice for view 1, the RF pulse (excitation pulse phase: 0 degree) transmitted to the fourth slice for view 1, the RF pulse (excitation pulse phase: 0 degree) transmitted to the third slice for view 2, and the RF pulse (excitation pulse phase: 180 degrees) transmitted to the second slice for view 2.

The side lobe in the fourth-slice region D is affected by the RF pulse (excitation pulse phase: 0 degree) transmitted to the fifth slice for view 1, the RF pulse (excitation pulse phase: 0 degree) transmitted to the fourth slice for view 1, the RF pulse (excitation pulse phase: 180 degrees) transmitted to the fifth slice for view 2, and the RF pulse (excitation pulse phase: 180 degrees) transmitted to the fourth slice for view 2.

The above study results are shown in Tables 6(a) to 6(c). Table 6(a) shows the results of study of the second slice; Table 6(b) shows the results of study of the third slice; and Table 6(c) shows the results of study of the fourth slice.

Tables 6(a) to 6(c)

(a)

| Slice number | 2 | | | | | | | |
|---|---|---|---|---|---|---|---|---|
| Side lobe (Overlap region) | A | | | | B | | | |
| Excitation pulse phase | 0 | 180 | 180 | 0 | 180 | 180 | 0 | 0 |
| Symbol | + | − | − | + | − | − | + | + |
| Sum of symbols | | | | 0 | | | | |

(b)

| Slice number | 3 | | | | | |
|---|---|---|---|---|---|---|
| Side lobe (Overlap region) | B | | | C | | |
| Excitation pulse phase | 180 | 180 | 0 | 180 | 0 | 0 |
| Symbol | − | − | + | − | + | + |
| Sum of symbols | | | 0 | | | |

(c)

| Slice number | 4 | | | | | | | |
|---|---|---|---|---|---|---|---|---|
| Side lobe (Overlap region) | C | | | | D | | | |
| Excitation pulse phase | 180 | 0 | 0 | 180 | 0 | 0 | 180 | 180 |
| Symbol | − | + | + | − | + | + | − | − |
| Sum of symbols | | | | 0 | | | | |

As shown in Tables 6(a) to 6(c), the sum of symbols for the side lobes in regions A and B of the RF pulses transmitted to the second slice is 0. The sum of symbols for the side lobes in regions B and C of the RF pulses transmitted to the third slice is 0. The sum of symbols for the side lobes in regions C and D of the RF pulses transmitted to the fourth slice is 0. This indicates that, for the side lobes of the RF pulses transmitted to the second, third, and fourth slices, the effects of the RF pulses with an excitation pulse phase of 0 degree and the effects of the RF pulses with an excitation pulse phase of 180 degrees are mutually canceled.

As explained above, when the RF pulse transmission method of the present embodiment is used, the sums of symbols for the side lobes of the RF pulses transmitted to the second, third, and fourth slices are 0, 0, and 0, respectively, indicating that the signal intensity is uniform between the adjacent slices.

Figure 5:
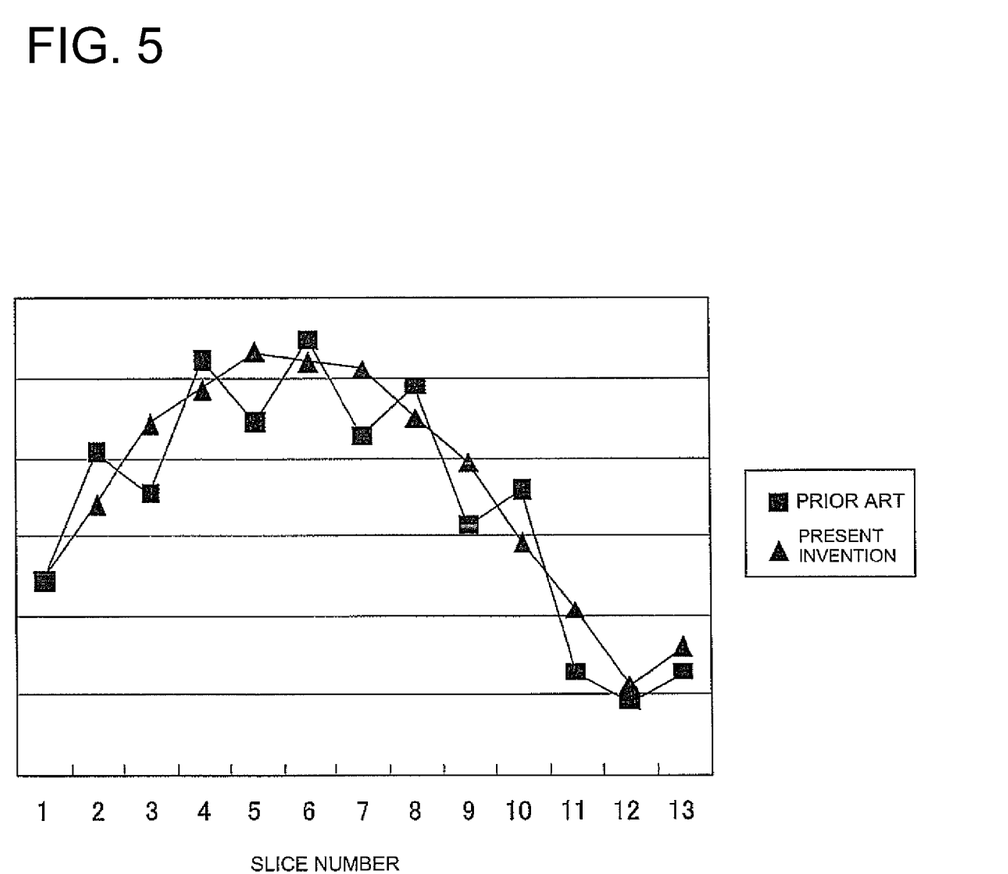
FIG. 5 is a graph showing results of signal intensity simulation made on slices in a spherical phantom.

FIG. 5 is a graph showing the results of signal intensity simulation made on slices in a spherical phantom. The vertical axis of the graph represents signal intensity, and the horizontal axis of the graph represents slice number. In FIG. 5, the filled squares (■) represent the intensities of signals obtained from the respective slices using the prior art RF pulse transmission method, and the filled triangles (▲) represent the intensities of signals obtained from the respective slices using the RF pulse transmission method according to the present invention.

As shown in FIG. 5, whereas the signal intensity obtained by using the prior art RF pulse transmission method irregularly varies from slice to slice, the signal intensity obtained by using the RF pulse transmission method according to the present invention varies smoothly through the slices in a manner corresponding to the shape of the spherical phantom.

As described above, using the RF pulse transmission method according to the present invention can uniformize the signal intensity between slices.

Images reconstructed based on magnetic resonance signals obtained using the prior art RF pulse transmission method and the RF pulse transmission method according to the present invention will be described in the following.

Figure 6A:
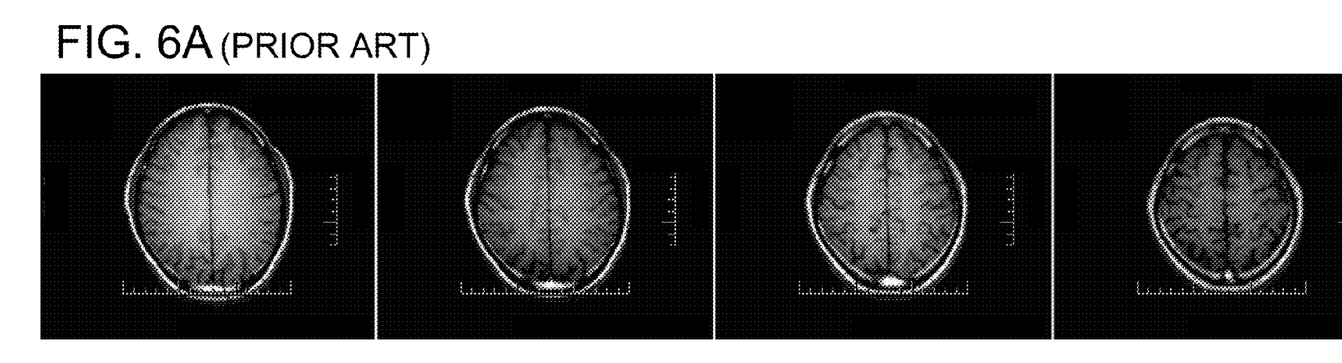
FIGS. 6(a) and 6(b) show transaxial slice images of a human head.
Figure 6B:
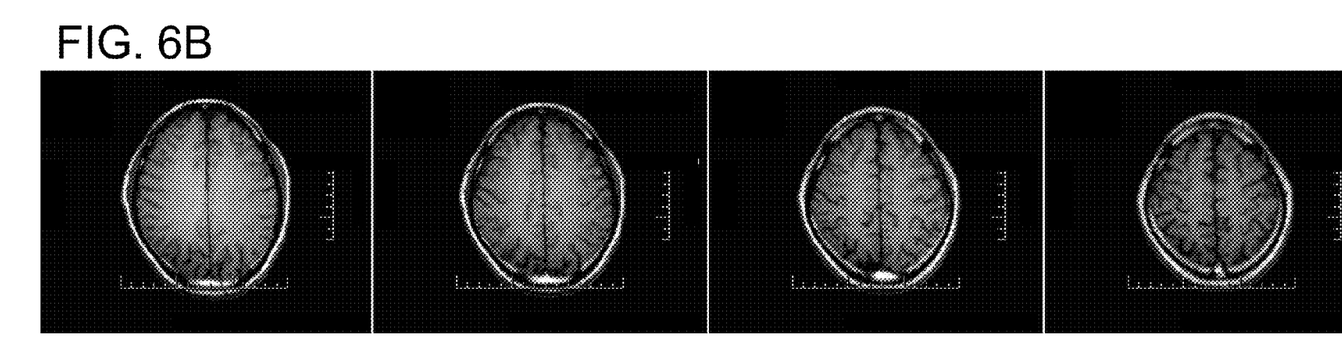

FIGS. 6(a) and 6(b) show transaxial slice images of a human head with FIG. 6(a) showing slice images obtained using the prior art RF pulse transmission method and FIG. 6(b) showing slice images obtained using the RF pulse transmission method according to the present invention.

The four images shown in FIG. 6(a) are, from left to right, the images of the second, third, fourth, and fifth slices obtained using the prior art method. As shown, the four images are, from left to right, bright, dark, bright, and dark.

The four images shown in FIG. 6(b) are, from left to right, the images of the second, third, fourth, and fifth slices obtained using the method of the present embodiment. Whereas brightness differs between the four images shown in FIG. 6(b) depending on imaged portions of the human head, the images of the third and fifth slices shown in FIG. 6(b) are brighter than the images of the third and fifth slices shown in FIG. 6(a). Thus, brightness variations between the slice images obtained using the RF pulse transmission method according to the present invention are smaller than those between the slice images obtained using the prior art method.

As described above, in the present embodiment of the present invention, multiple slice images based on uniform signal intensity can be obtained.

The present invention is not limited to the above embodiment, and the invention can be embodied in various modified forms.

Even though, in the above embodiment of the invention, the number of slices is 13, when the number is four or larger, the present invention makes it possible to make the sum of symbols for the side lobes of the RF pulses transmitted to the slices zero and uniformize the signal intensity between the slices.

Even though, in the above embodiment of the present invention, the phases of the excitation pulses transmitted to the slices are 0 degree or 180 degrees, the excitation pulses may be transmitted at different mutually reversed phases, for example, at 10 degrees and 190 degrees.

Even though, in the above embodiment of the present invention, the refocusing pulses transmitted to the slices are phased at 90 degrees, their phases may be arbitrarily set to be other than 90 degrees.

Even though, in the above embodiment of the present invention, RF pulse sequences are transmitted using the spin echo method, a different method, for example, a gradient echo method, may be used.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance imaging apparatus configured to:
   repeat, for a plurality of consecutive repetition times, transmission of an RF pulse to each of a plurality of slices;
   scan the plurality of slices to acquire magnetic resonance signals generated therein, in multi-slice acquisition covering the plurality of sequential slices in a subject, the plurality of sequential slices including at least a first slice, a second slice, a third slice, and a fourth slice, wherein, in the first, second, third, and fourth slices, phases of the RF pulses are alternately reversed every consecutive repetition time, and the RF pulses are transmitted to the first, second, third, and fourth slices such that the phases of the RF pulses transmitted to the first and third slices are reversed from each other in each of the plurality of consecutive repetition times and such that the phases of the RF pulses transmitted to the second and fourth slices are reversed from each other in each of the plurality of consecutive repetition times; and
   generate slice images based on the magnetic resonance signals.

2. The magnetic resonance imaging apparatus according to claim 1, wherein the first, third, second, and fourth slices are scanned in this order.

3. The magnetic resonance imaging apparatus according to claim 1, wherein odd-numbered slices are scanned first, and even-numbered slices are scanned next.

4. The magnetic resonance imaging apparatus according to claim 1, wherein the magnetic resonance signals are acquired by a spin echo method.

5. The magnetic resonance imaging apparatus according to claim 1, wherein the magnetic resonance signals are acquired by a gradient echo method.

6. The magnetic resonance imaging apparatus according to claim 1, wherein the first, second, third, and fourth slices are mutually parallel.

7. The magnetic resonance imaging apparatus according to claim 2, wherein the first, second, third, and fourth slices are mutually parallel.

8. The magnetic resonance imaging apparatus according to claim 3, wherein the first, second, third, and fourth slices are mutually parallel.

9. The magnetic resonance imaging apparatus according to claim 4, wherein the first, second, third, and fourth slices are mutually parallel.

10. A method for transmitting RF pulses to a plurality of slices, in multi-slice acquisition covering a plurality of sequential slices in a subject, the plurality of sequential slices including at least a first slice, a second slice, a third slice, and a fourth slice, said method comprising:

alternately reversing, for the first, second, third, and fourth slices, phases of the RF pulses every consecutive repetition time;

transmitting the RF pulses to the first, second, third, and fourth slices such that the phases of the RF pulses transmitted to the first and third slices are reversed from each other in each of the plurality of consecutive repetition times and such that the phases of the RF pulses transmitted to the second and fourth slices are reversed from each other in each of the plurality of consecutive repetition times;

scanning the plurality of slices to acquire magnetic resonance signals; and generating slice images based on the magnetic resonance signals.

11. The method for transmitting RF pulses according to claim 10, wherein scanning the plurality of slices comprises scanning the first, third, second, and fourth slices in this order.

12. The method for transmitting RF pulses according to claim 10, wherein scanning the plurality of slices comprises scanning odd-numbered slices first, and scanning even-numbered slices next.

13. The method for transmitting RF pulses according to claim 10, wherein transmitting the RF pulses comprises using a spin echo sequence as a pulse sequence.

14. The method for transmitting RF pulses according to claim 10, wherein transmitting the RF pulses comprises using a gradient echo sequence as a pulse sequence.

15. The method for transmitting RF pulses according to claim 10, wherein the first, second, third, and fourth slices are mutually parallel.

16. One or more computer-readable non-transitory media comprising a computer-executable program that instructs at least one processor to generate slice images, said computer-executable program comprising at least one code segment that:

repeats, for a plurality of consecutive repetition times, transmission an RF pulse to each of a plurality of slices;

scans the plurality of slices to acquire magnetic resonance signals generated therein, in multi-slice acquisition covering the plurality of sequential slices in a subject, the plurality of sequential slices including at least a first slice, a second slice, a third slice, and a fourth slice, wherein the computer is further caused to perform a procedure in which, in the first, second, third, and fourth slices, phases of the RF pulses are alternately reversed every consecutive repetition time, and the RF pulses are transmitted to the first, second, third, and fourth slices such that the phases of the RF pulses transmitted to the first and third slices are reversed from each other in each of the plurality of consecutive repetition times and such that the phases of the RF pulses transmitted to the second and fourth slices are reversed from each other in each of the plurality of consecutive repetition times; and generates the slice images based on the magnetic resonance images.

17. The one or more computer-readable non-transitory media according to claim 16, said computer-executable program further comprising at least one code segment that scans the first, third, second, and fourth slices in this order.

18. The one or more computer-readable non-transitory media according to claim 16, said computer-executable program further comprising at least one code segment that scans odd-numbered slices first and even-numbered slices next.

19. The one or more computer-readable non-transitory media according to claim 16, said computer-executable program further comprising at least one code segment that transmits the RF pulses using a spin echo sequence as a pulse sequence.

20. The one or more computer-readable non-transitory media according to claim 16, said computer-executable program further comprising at least one code segment that transmits the RF pulses using a gradient echo sequence as a pulse sequence.

\* \* \* \* \*